US008950850B2

(12) United States Patent
Wang

(10) Patent No.: US 8,950,850 B2
(45) Date of Patent: Feb. 10, 2015

(54) LIQUID EJECTION HEAD AND METHOD OF MANUFACTURING THE SAME

(71) Applicant: Canon Kabushiki Kaisha, Tokyo (JP)

(72) Inventor: Shinan Wang, Kashiwa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/915,919

(22) Filed: Jun. 12, 2013

(65) Prior Publication Data

US 2013/0342613 A1 Dec. 26, 2013

(30) Foreign Application Priority Data

Jun. 22, 2012 (JP) ................................ 2012-140725

(51) Int. Cl.

| | |
|---|---|
| ***B41J 2/045*** | (2006.01) |
| ***H01L 41/22*** | (2013.01) |
| ***B41J 2/14*** | (2006.01) |
| ***B41J 2/16*** | (2006.01) |

(52) U.S. Cl.

CPC ............ *B41J 2/14201* (2013.01); *B41J 2/1621* (2013.01); *B41J 2/14209* (2013.01); *B41J 2/1609* (2013.01); *B41J 2/1631* (2013.01); *B41J 2/1634* (2013.01); *B41J 2/1642* (2013.01); *B41J 2/1646* (2013.01)

USPC ............................... 347/71; 347/68; 29/25.35

(58) Field of Classification Search

None

See application file for complete search history.

(56) References Cited

U.S. PATENT DOCUMENTS

| | | | |
|---|---|---|---|
| 8,016,387 | B2 | 9/2011 | Watanabe |
| 2013/0162725 | A1 | 6/2013 | Suzuki et al. |
| 2013/0220522 | A1 | 8/2013 | Wang |

FOREIGN PATENT DOCUMENTS

| | | | | |
|---|---|---|---|---|
| JP | 2007-168319 A | | 7/2007 | |
| JP | 2008-143167 A | | 6/2008 | |
| WO | WO 2011/155129 A1 | * | 12/2011 | ................ B41J 2/14 |

* cited by examiner

*Primary Examiner* — Geoffrey Mruk

(74) *Attorney, Agent, or Firm* — Fitzpatrick, Cella, Harper & Scinto

(57) ABSTRACT

A liquid ejection head has a plurality of pressure chambers each communicating with an ejection port at one end and with an ink supply port at the other end. Each of the pressure chambers has lateral walls formed by piezoelectric elements and configured so as to eject ink from the corresponding ejection port as a result of a capacity change of the pressure chamber due to an expansion or contraction of the piezoelectric elements. The liquid ejection head is constituted by a plate-shaped piezoelectric portion and a plurality of column-shaped piezoelectric portions arranged thereon. The plate-shaped piezoelectric portion has a plurality of holes and a plurality of through holes located around the holes. Each of the column-shaped piezoelectric portions has a hollow section. Each hole of the plate-shaped piezoelectric portion and the hollow section of the corresponding column-shaped piezoelectric portion form a pressure chamber.

6 Claims, 4 Drawing Sheets

LIQUID EJECTION HEAD AND METHOD OF MANUFACTURING THE SAME

BACKGROUND OF THE INVENTION

1. Field of the Invention

The present invention relates to a liquid ejection head having a piezoelectric element substrate and a method of manufacturing the same.

2. Description of the Related Art

Liquid ejection heads including a piezoelectric element substrate that contains a piezoelectric material such as PZT (Pb(Zr,Ti)$O_3$: lead zirconate titanate) are known.

Pressure chambers for applying ejection pressure onto ink are formed in a liquid ejection head including a piezoelectric element substrate, and electrodes are arranged respectively on the inner surface and on the outer surface of the lateral wall of each pressure chamber and electrically connected to a head substrate. As a voltage is applied between the electrodes from the head substrate, the lateral wall of the pressure chamber is deformed to change the capacity of the pressure chamber so that ejection pressure is applied to the ink in the pressure chamber and ink droplets are ejected from the ejection port that is held in communication with the pressure chamber.

Japanese Patent Application Laid-Open No. 2008-143167 discloses a harmonica type liquid ejection head. In the harmonica structure of the disclosed liquid ejection head, pressure chambers and apertures are alternately arranged in the direction of arrangement of pressure chambers within the piezoelectric element substrate of the liquid ejection head. Thus, the two lateral walls of a pressure chamber sandwiched between the pressure chambers and the respective apertures can be deformed by electrically driving the piezoelectric element substrate.

Japanese Patent Application Laid-Open No. 2007-168319 discloses a pinholder type liquid ejection head including pressure chambers, and the lateral walls of the pressure chambers located at the ejection port side of the liquid ejection head are independently arranged, whereas the lateral walls of the pressure chambers located at the ink supply port side that is opposite to the ejection port side are linked to each other. With the pinholder structure, four lateral walls at the ejection port side where the lateral walls are independently arranged can be deformed at a time by electrically driving the piezoelectric element substrate so that a greater capacity change can be realized.

However, with a liquid ejection head having a harmonica structure as described in Japanese Patent Application Laid-Open No. 2008-143167, the deformations of the piezoelectric element substrate structurally give rise to crosstalk to a large extent because the pressure chambers are connected throughout the full length of the respective pressure chambers.

With a liquid ejection head having a pinholder structure as described in Japanese Patent Application Laid-Open No. 2007-168319, the deformations of the piezoelectric element substrate structurally give rise to crosstalk to a lesser extent because the pressure chambers are held independent from each other at the drivable part of the respective pressure chambers. However, the linked parts of the lateral walls cannot be driven with this structure. If the drivable parts are to be made longer, the only possible way to do so is to make the independent parts of the pressure chambers longer. Then, the mechanical strength of the pressure chambers is inevitably reduced. Particularly, when ejection ports are to be arranged highly densely, the mechanical strength of the pressure chambers are reduced further because the aspect ratio of the independent parts of the pressure chambers is large.

SUMMARY OF THE INVENTION

In view of the above-identified problems, an object of the present invention is to provide a liquid ejection head that can suppress the crosstalk attributable to the structure thereof and has a satisfactory mechanical strength and also a method of manufacturing such a liquid ejection head.

In an aspect of the present invention, there is provided a liquid ejection head having a plurality of pressure chambers with lateral walls formed by using piezoelectric elements, an end of each of the pressure chambers being held in communication with an ejection port for ejecting ink, the opposite end being held in communication with a supply port for supplying ink to the pressure chamber, the liquid ejection head being so configured as to eject ink from each of the ejection ports as a result of a capacity change of each of the pressure chambers due to an expansion or contraction of the piezoelectric elements, the liquid ejection head including: a piezoelectric element substrate formed by using piezoelectric elements and having: a plate-shaped piezoelectric portion having a plurality of holes running through the plate-shaped piezoelectric portion from a surface thereof to the opposite surface and a plurality of through holes located around the holes; and a plurality of column-shaped piezoelectric portions arranged on one of the surfaces of the plate-shaped piezoelectric portion at positions corresponding to the holes of the plate-shaped piezoelectric portion and having respective hollow sections open at the opposite ends thereof; each of the holes of the plate-shaped piezoelectric portion and the hollow section of the corresponding one of the column-shaped piezoelectric portions forming a pressure chamber having an end thereof located at the side of the column-shaped piezoelectric portion and the opposite end located at the side of the plate-shaped piezoelectric portion.

Further features of the present invention will become apparent from the following description of exemplary embodiments with reference to the attached drawings.

DESCRIPTION OF THE EMBODIMENTS

Now, the present invention will be described in greater detail below by referring to the accompanying drawings that illustrate embodiments of the invention. Throughout the drawings, the components having the same functional features are denoted by the same reference symbols and will not be described repeatedly.

First Embodiment

Figure 1A:
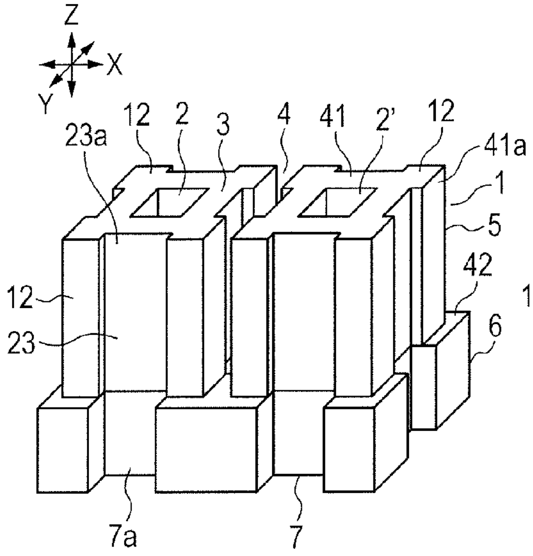
FIGS. 1A, 1B, 1C and 1D are schematic illustrations of the first embodiment of the piezoelectric element substrate of a liquid ejection head according to the present invention, representing the configuration thereof.
Figure 1B:
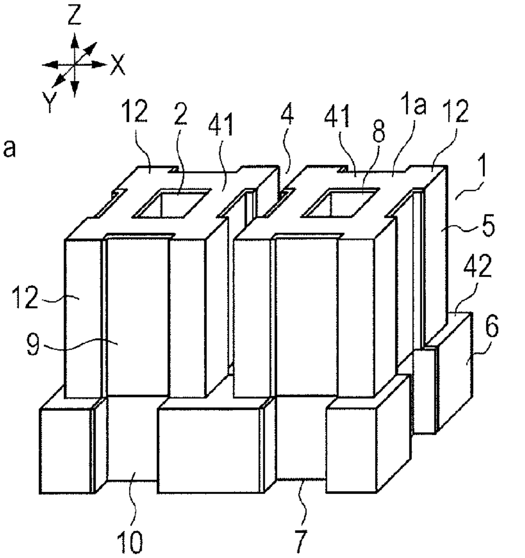
Figure 1C:
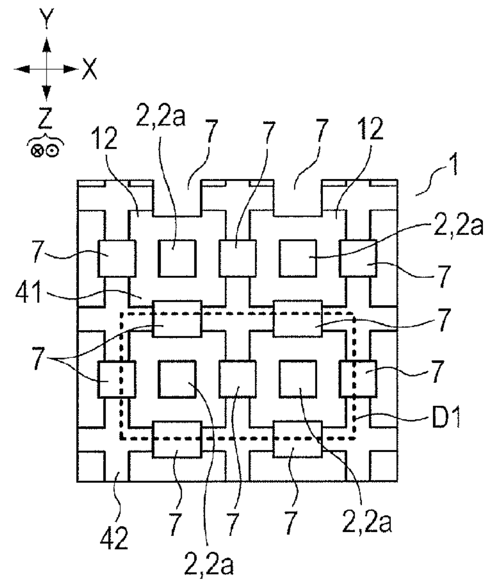
Figure 1D:
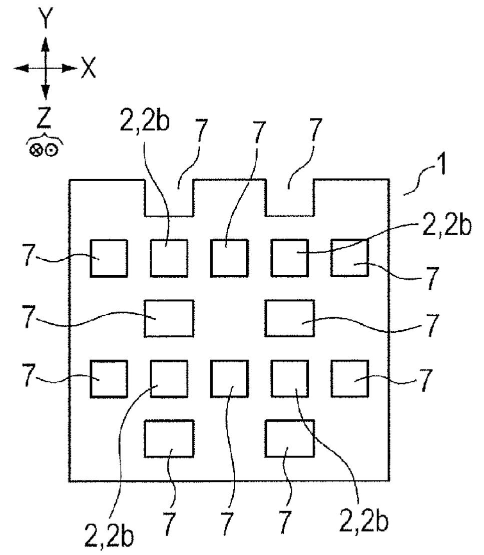

The structure of the first embodiment of piezoelectric element substrate of a liquid ejection head according to the present invention will be described below by referring to FIGS. 1A through 1D. FIGS. 1A through 1D are schematic illustrations of the first embodiment of piezoelectric element substrate of a liquid ejection head according to the present invention, representing the configuration thereof. FIGS. 1A and 1B are schematic perspective views of the part of the piezoelectric element substrate enclosed with a broken line D1 in FIG. 1C and FIG. 1C is a schematic illustration of the piezoelectric element substrate as viewed from the side of an end thereof, whereas FIG. 1D is a schematic illustration of the piezoelectric element substrate as viewed from the side of the opposite end thereof. FIGS. 1A, 1C and 1D illustrate the piezoelectric element substrate in a state of not being provided with electrodes, whereas FIG. 1B illustrates the piezoelectric element substrate in a state of being provided with electrodes. In the piezoelectric element substrate of a liquid ejection head according to the present embodiment, a plurality of pressure chambers are arranged periodically both in the X-direction (in the row direction) and in the Y-direction (in the column direction).

The piezoelectric element substrate 1 has an independent part 5 and a continuous part 6 linked to the independent part 5.

A plurality of hollow rectangular prism-shaped, or column-shaped piezoelectric portions 41, each being formed by using of a piezoelectric element, are arranged in the independent part 5 and the internal space of each of the column-shaped piezoelectric portions 41 operates as a pressure chamber 2*a*. Adjacently located column-shaped piezoelectric portions 41 are separated by gaps. In other words, a space 4 exists between any two adjacent column-shaped piezoelectric portions 41.

A plurality of pressure chambers 2*b* that are so many holes are formed in the continuous part 6 and arranged in the thickness direction of plate-shaped piezoelectric portion 42 that is made of a plate-shaped piezoelectric element. The column-shaped pressure chambers 41 are arranged on the plate-shaped piezoelectric portion 42 such that a pressure chamber 2 is formed by each of the pressure chambers 2*b* of the continuous part 6 and a corresponding one of the pressure chambers 2*a* of the independent part 5.

Each of the pressure chambers 2 is held in communication with an ejection port (not illustrated) for ejecting liquid such as ink from the pressure chamber 2 at an end of the pressure chamber 2 (at the end of the independent part 5 opposite to the continuous part 6). It is also held in communication with a supply port (not illustrated) for supplying ink at the other end of the pressure chamber 2 (at the end of the continuous part 6 opposite to the independent part 5).

In the independent part 5, a groove 23 is formed on each of the outer surfaces 41*a* of each of the column-shaped piezoelectric portions 41 at a position squarely opposite to the pressure chamber 2 formed in the inside of the column-shaped piezoelectric portion 41. As a result, a projecting section 12 is produced at each corner of the column-shaped piezoelectric portion 41 as viewed on a cross section taken perpendicularly relative to the height direction of the column-shaped piezoelectric portion 41.

Through holes 7 are formed so as to run through from a surface of the plate-shaped piezoelectric portion 42 to the opposite surface and sandwich a pressure chamber 2 between any two of them as viewed from the side where an end of each of the pressure chambers 2 is located. Each of the through holes 7 has an inner surface 7*a* that is flush with the bottom surface 23*a* of the corresponding groove 23 of the column-shaped piezoelectric portion 41 in the independent part 5. In other words, a continuous flat surface is formed by the bottom surface 23*a* of the groove 23 and the inner surface 7*a* of the through hole 7.

In this embodiment, the pressure chambers 2 are arranged periodically both in the X-direction (in the row direction) and in the Y-direction (in the column direction) as viewed from the side of an end of the piezoelectric element substrate. In the continuous part 6, four through holes 7 are arranged around each pressure chamber 2*b*. The width of each of the through holes 7 arranged around each pressure chamber 2 is greater than the shortest distance separating any two adjacently located projecting sections 12 of two adjacently located pressure chambers 2 in the X-direction or in the Y-direction of the pressure chambers 2. With this structure, the thickness of each of the lateral walls of the column-shaped piezoelectric portions 41 is the same as the distance between the pressure chamber 2*b* thereof and each of the through holes 7 all the way in the height direction (in the Z-direction) of the column-shaped piezoelectric portions 41.

A first electrode 8 is arranged on the lateral surfaces 2' of each of the pressure chambers 2 (and hence on the inner surfaces of each of the column-shaped piezoelectric portions 41). A second electrode 9 is arranged on each of the grooves 23 at the outer surfaces 41 of each of the column-shaped piezoelectric portions 41 in the independent part 5. A third electrode 10 is arranged on the inner surface 7*a* of each of the through holes 7 in the continuous part 6. The first electrodes 8 are electrically insulated from the second electrodes 9 and the third electrodes 10. On the other hand, the second electrodes 9 and the third electrodes 10 may be independent from each other or electrically connected to each other.

In the above-described piezoelectric element substrate 1 of a liquid ejection head, each of the column-shaped piezoelectric portions 41 of the independent part 5 is polarized in the directions in which the outer surfaces 41*a* thereof are disposed vis-a-vis the lateral surfaces 2' of the pressure chamber 2 (in the X-direction and in the Y-direction in FIGS. 1A through 1D). Similarly, the plate-shaped piezoelectric portion 42 of the continuous part 6 is polarized in the directions in which the inner surfaces 7*a* of the through holes 7 are disposed vis-a-vis the inner surfaces 2' of the pressure chambers 2 (in the X-direction and in the Y-direction in FIGS. 1A through 1D).

The column-shaped piezoelectric portions 41 and the plate-shaped piezoelectric portion 42 that are formed by using piezoelectric elements can expand and contract according to the drive signals applied between the first electrodes 8 and the second electrodes 9 and between the first electrodes 8 and the third electrodes 10 to eject ink stored in the pressure chambers 2. In other words, the liquid ejection head of this embodiment is a so-called Gould type liquid ejection head. The same drive signal may be applied to the second electrodes 9 and to the third electrodes 10. Alternatively different drive signals may be applied respectively and independently to the second electrodes 9 and to the third electrodes 10. The column-shaped piezoelectric portions 41 and the plate-shaped piezoelectric portion 42 can be displaced independently to realize a so-called double actuator drive when independent drive signals are applied to the second electrodes 9 and to the third electrodes 10.

In this embodiment, the column-shaped piezoelectric portions 41 are not held in contact with each other but independent from each other in the independent part 5 of the piezoelectric element substrate 1 so that the deformations of the piezoelectric element substrate structurally give rise to crosstalk only to a small extent in the independent part 5. Additionally, because four through holes 7 are arranged around each pressure chamber 2 in the continuous part 6, the deformations of the piezoelectric element substrate also structurally give rise to crosstalk to a small extent in the continuous part 6 due to the harmonica structure of having two apertures (through holes) around each pressure chamber.

The piezoelectric element substrate 1 of this embodiment can drive the plate-shaped piezoelectric portion of the continuous part 6 and hence, if the pressure chambers 2 are required to have a large length, the requirement of having a large length can be met in a shared manner by the column-shaped piezoelectric portions 41 of the independent part 5 and the plate-shaped piezoelectric portion 42 of the continuous part 6. Then, as a result, the aspect ratio of the pressure chambers 2*a* (in the column-shaped piezoelectric portions 41) of the independent parts 5 is not required to be forcibly made large. Thus, the piezoelectric element substrate 1 can provide a satisfactory mechanical strength that is higher than any conventional simple pinholder structure.

Additionally, since the column-shaped piezoelectric portions 41 in the independent part 5 have projecting sections 12, the independent part 5 can provide a satisfactory mechanical strength that is higher than any conventional simple pinholder structure. Furthermore, as a result of a simulation, the inventors of the present invention found that, because of the provision of the projecting sections 12, the independent part 5 has a higher rigidity and, the pressure chambers 2 having the projection sections 12 can achieve a larger capacity change if compared with a comparable structure having no such projection sections 12.

Second Embodiment

Figure 2A:
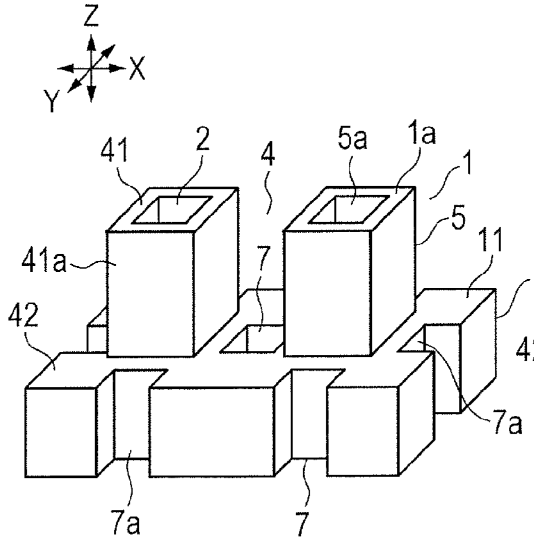
FIGS. 2A, 2B, 2C and 2D are schematic illustrations of the second embodiment of the piezoelectric element substrate of a liquid ejection head according to the present invention, representing the configuration thereof.
Figure 2B:
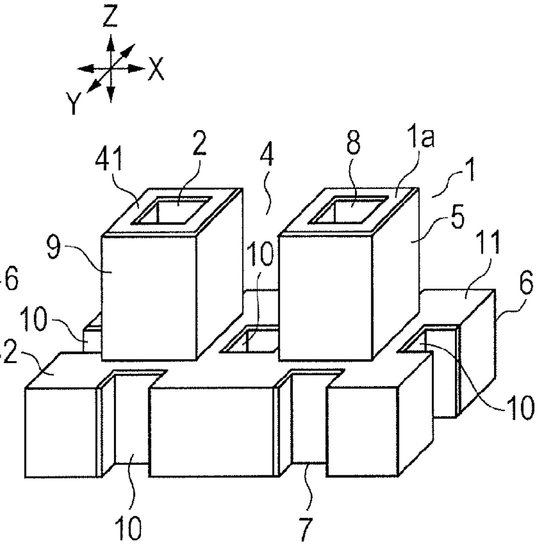
Figure 2C:
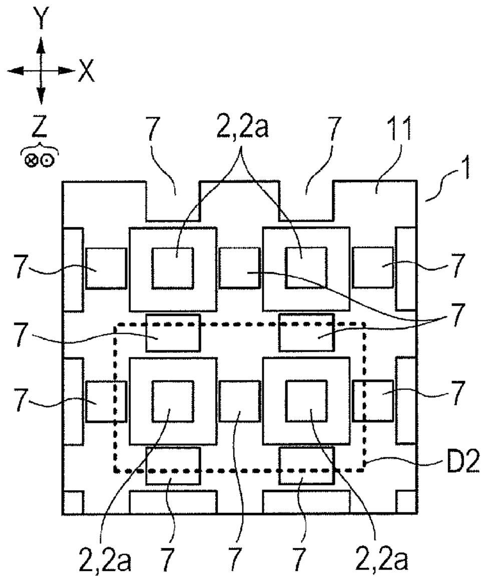
Figure 2D:
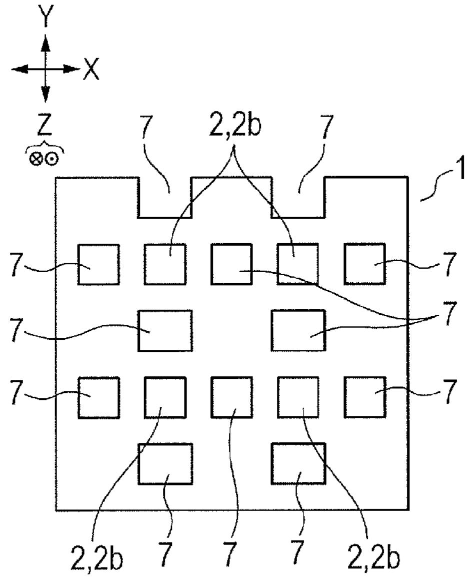

The structure of the second embodiment of piezoelectric element substrate of a liquid ejection head according to the present invention will be described below by referring to FIGS. 2A through 2D. FIGS. 2A through 2D are schematic illustrations of the second embodiment of piezoelectric element substrate of a liquid ejection head according to the present invention, representing the configuration thereof. FIGS. 2A and 2B are schematic perspective views of the part of the piezoelectric element substrate enclosed with a broken line D2 in FIG. 2C and FIG. 2C is a schematic illustration of the piezoelectric element substrate as viewed from the side of an end thereof, whereas FIG. 2D is a schematic illustration of the piezoelectric element substrate as viewed from the side of the opposite end thereof. FIGS. 2A, 2C and 2D illustrate the piezoelectric element substrate in a state of not being provided with electrodes, whereas FIG. 2B illustrates the piezoelectric element substrate in a state of being provided with electrodes. In this embodiment of piezoelectric element substrate of a liquid ejection head according to the present invention, a plurality of pressure chambers are arranged periodically both in the X-direction (in the row direction) and in the Y-direction (in the column direction).

The components of the second embodiment that are the same as or similar to their counterparts of the first embodiment are denoted by the same reference symbols and will not be described repeatedly. The second embodiment will be described below only in terms of the differences between the first embodiment and the second embodiment.

The piezoelectric element substrate 1 of this embodiment has a plurality of pressure chambers 2 arranged periodically both in the X-direction (in the row direction) and in the Y-direction (in the column direction). In the independent part 5, the outer surfaces 41*a* of the column-shaped piezoelectric portions 41 are flat and hence the column-shaped piezoelectric portions 41 are provided with neither grooves 23 nor projecting sections 12. Additionally, in the continuous part 6, the width of each of the through holes 7 is smaller than the shortest distance separating column-shaped piezoelectric portions 41 of two adjacently located pressure chambers 2 that sandwich the through hole 7. In other words, the outer edges of each of the column-shaped piezoelectric portions 41 do not agree respectively with the corresponding edges of the through holes 7 as viewed from the side of the ends of the column-shaped piezoelectric portions 41 that are not held in contact with the plate-shaped piezoelectric portion 42. With this structure, the thickness of each of the column-shaped piezoelectric portions 41 in the independent part 5 is smaller than the shortest distance separating each of the pressure chambers 2 from the through holes 7 in the continuous part 6.

In this embodiment, a second electrode is arranged on the outer surfaces 41*a* of each of the column-shaped piezoelectric portions 41. The first electrodes 8 for driving the piezoelectric element substrate 1 are electrically insulated from the second electrodes 9 and the third electrodes 10. On the other hand, the second electrodes 9 and the third electrodes 10 may be independent from each other or electrically connected to each other. In FIG. 2B, the second electrodes 9 and the third electrodes 10 are independent from each other. When the second electrodes 9 and the third electrodes 10 are to be electrically connected to each other, they may be connected to each other, for instance, by way of the surface 11 of the continuous part 6.

In this embodiment again, any adjacently located column-shaped piezoelectric portions 41 are not held in contact with each other but independent from each other in the independent part 5 of the piezoelectric element substrate 1 so that the piezoelectric element substrate structurally gives rise to crosstalk only to a small extent in the independent part 5. Additionally, because four through holes 7 are arranged around each pressure chamber 2 in the continuous part 6, the piezoelectric element substrate also structurally gives rise to crosstalk to a small extent in the continuous part 6 due to the harmonica structure of having two apertures (through holes). The piezoelectric element substrate 1 of this embodiment can drive the plate-shaped piezoelectric portion 42 of the continuous part 6 and hence, if the pressure chambers 2 are required to have a large length, the requirement of having a large length can be met in a shared manner by the column-shaped piezoelectric portions 41 of the independent part 5 and the plate-shaped piezoelectric portion 42 of the continuous part 6. Then, as a result, the aspect ratio of the pressure chambers 2*a* (in the column-shaped piezoelectric portions 41) of the independent parts 5 is not required to be forcibly made large. Thus, the piezoelectric element substrate 1 can provide a satisfactory mechanical strength that is higher than any conventional simple pinholder structure.

Manufacturing Method

Now, a method of manufacturing a piezoelectric element substrate of a liquid ejection head according to an embodiment of the present invention will be described below by referring to FIGS. 3A through 3H. FIGS. 3A through 3H are schematic illustrations of a method of manufacturing a piezoelectric element substrate of a liquid ejection head according to an embodiment of the present invention. The components of the embodiment that are the same as or similar to their counterparts of the above-described embodiments are denoted by the same reference symbols and will not be described repeatedly.

For the piezoelectric element substrate, piezoelectric plates are subjected to processes for electrode formation, groove machining, polarization and so on and a plurality of processed piezoelectric plates are laid one on the other to prepare a laminated body of piezoelectric plates that has two-dimensionally arranged pressure chambers (or ejection ports). Then, the independent part is formed by forming grooves for separating the pressure chambers on a surface connected to the ejection ports of the laminated body. The method will be described more specifically below.

Figure 3A:
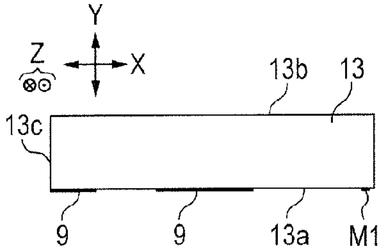
FIGS. 3A, 3B, 3C, 3D, 3E, 3F, 3G and 3H are schematic illustrations of a method of manufacturing a piezoelectric element substrate of a liquid ejection head according to an embodiment of the present invention.

Firstly, a first piezoelectric plate 13 as illustrated in FIG. 3A is brought in. The first piezoelectric plate 13 may typically be a PZT plate having dimensions of 50 mm×50 mm×0.25 mm.

Then, a first mark M1 is formed on the first main surface 13*a* of the first piezoelectric plate 13 as alignment mark. The first mark M1 can be formed by producing a pattern on the first main surface 13*a* of the first piezoelectric plate 13 by ordinary machining or laser machining. Alternatively, the first mark M1 may be formed as a metal film pattern that is produced by means of a metal film lift-off technique or an etching technique that includes a photolithography process.

Thereafter, second electrodes 9 are formed on the first main surface 13*a*. The positions of the second electrodes 9 are determined by referring to the first mark M1. Techniques that can be used for forming the second electrodes 9 include a metal film lift-off technique that includes steps of photolithography, metal film formation and resist peeling off. Suitable techniques for forming metal film include sputtering and chemical vapor deposition (CVD). After forming a thin seed film on the first piezoelectric plate 13 by means of a metal film lift-off technique, relatively thick metal films may be formed by plating as the second electrodes 9. An example of seed layer is a two-layered film of Pd/Cr. An example of a relatively thick metal film is a layer of Au/Ni.

When the first mark M1 is formed as a metal pattern, the second electrodes 9 are preferably formed by means of the same technique as the technique that is employed for forming the first mark M1 simultaneously at the time of forming the first mark M1. As a result of the simultaneous formation, the positions of the second electrodes 9 relative to the first mark M1 can be highly accurately determined.

Figure 3B:
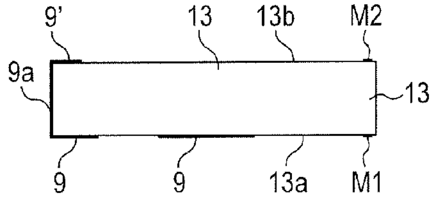

Then, as illustrated in FIG. 3B, a second electrode pad 9' is formed on the second main surface 13*b* of the first piezoelectric plate 13 that is located opposite to the first main surface 13*a*. Additionally, an electrode wiring 9*a* is formed on three surfaces of the first piezoelectric plate 13 including a lateral surface 13*c* (see FIG. 3A) of the first piezoelectric plate 13 to electrically connect the second electrodes 9 formed on the first main surface 13*a* and the second electrode pad 9'.

Additionally, a second mark M2 is formed on the second main surface 13*b* at a position determined by referring to the first mark M1 formed on the first main surface 13*a*. The electrode wiring 9*a*, the second electrode pad 9' and the second mark M2 are formed simultaneously by means of the technique described below.

Firstly, a seed layer for forming a second electrode pad 9', electrode wiring 9*a* and a second mark M2 is formed on the first piezoelectric plate 13 by means of a metal film lift-off technique that includes a photolithography step. More specifically, a 20 nm-thick Cr layer and a 150 nm-thick Pd layer are sequentially formed as seed layer on the second main surface 13*b* and on the lateral surface 13*c* of the first piezoelectric plate 13 by sputtering. For the sputtering operation, the second main surface 13*b* is arranged vis-a-vis the target of sputtering. However, a seed layer for forming the electrode wiring 9*a* can be formed on the lateral surface 13*c* of the first piezoelectric plate 13 simultaneously when a seed layer is formed for forming the second mark M2 and the second electrode pad 9' by utilizing the coating effect of sputtering.

Subsequently, an about 1 μm-thick Ni thin film and an about 0.1 μm-thick Au thin film are sequentially formed by way of an electroless plating process, utilizing the above-described seed layer so as to actually produce the second electrode pad 9', the electrode wiring 9*a* and the second mark M2. As a result, the second electrodes 9 formed on the first main surface 13*a* of the first piezoelectric plate 13 are led out onto the second main surface 13*b* of the first piezoelectric plate 13 by means of the electrode wiring 9*a* and the second electrode pad 9'. Additionally, the second mark M2 is formed by referring to the first mark M1.

Figure 3C:
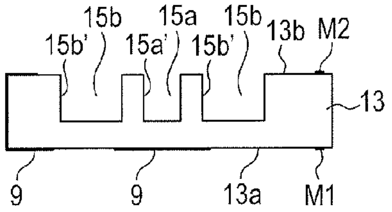

Then, as illustrated in FIG. 3C, a first groove 15*a* that constitutes a part of the pressure chamber 2 and second grooves 15*b* that constitute parts of respective running-through sections 7 are formed on the second main surface 13*b* of the first piezoelectric plate 13 by referring to the second mark M2, the first groove 15*a* being sandwiched between the second grooves 15*b*. The positions of the second electrodes 9 are determined by referring to the first mark M1 and the position of the second mark M2 is also determined by referring to the first mark M1. Therefore, the position of the first groove 15*a* and the positions of the second electrodes 9 can be made to exactly correspond to each other by determining the position of the first groove 15*a* and the positions of the second grooves 15*b* by referring to the second mark M2.

The first groove 15*a* and the second grooves 15*b* may have different dimensions in terms of the dimension in the thickness direction Y (to be referred to as "groove depth" hereinafter), in terms of the dimension in the direction Z in which the grooves extend (the direction perpendicular to the sheet of FIGS. 3A through 3H) and in terms of the dimension in the direction X rectangularly intersecting the thickness direction Y (to be referred to as "groove width" hereinafter). A grinding technique using a super-abrasive grinding wheel can suitably be used to form the first groove 15*a* and the second grooves 15*b*. As an example, both the first grooves 15*a* and the second grooves 15*b* have the same dimension and are arranged periodically with the same cycle period and in parallel at regular intervals. The length of each of the grooves (the dimension in the Z-direction) is 50 mm and the groove width is 0.1 mm while the groove depth is 0.15 mm, the gap separating any two adjacent grooves being 0.212 mm.

Figure 3D:
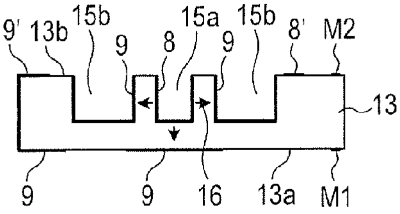

Then, as illustrated in FIGS. 3C and 3D, first electrodes 8 are formed on the inner surface 15*a*' of the first groove 15*a* and on the second main surface 13*b* that is left after forming the grooves. At the same time, second electrodes 9 are formed respectively on the inner surfaces 15*b*' of the second grooves 15*b* and a first electrode pad 8' is formed on the second main surface 13*b* that is left after forming the grooves.

A plurality of electrode wirings (not illustrated) is formed on the second main surface 13*b* simultaneously when the first electrode 8 is formed. Then, the electrode 8 formed on the inner surface 15*a*' of the first groove 15*a* is electrically connected to the first electrode pad 8' by using some of the plurality of electrode wirings. Out of the second electrodes 9, the second electrodes 9 that are formed on the inner surfaces 15*b*' of the second grooves 15*b* are electrically connected to the second electrode pad 9' by using the electrode wirings that are not connected to the first electrode 8 out of the plurality of electrode wirings. Note that the first electrode pad 8' and the second electrode pad 9' are electrically isolated from each other.

The technique of forming the second electrodes 9 on the first main surface 13*a* as described above by referring to FIG. 3A may also be used for forming the first electrode 8, the first electrode pad 8', the second electrodes 9 and the electrode wirings (not illustrated) on the second main surface 13*b*.

Note, however, the use of dry film resist is suitable as resist at the time of a photolithography operation when the groove 15*a* and the grooves 15*b* are on the second main surface 13*b*.

Subsequently, an electric field is applied between the first electrode pad 8' and the second electrode pad 9' to execute a polarization process on the lateral surfaces and the bottom surface of the first groove 15*a*. The main directions of the polarization are the directions indicated by arrows 16 in FIG. 3D. When executing the polarization process, the intensity of the electric field and the temperature are selected so as to make them match the characteristics of the material of the first piezoelectric plate 13. For example, the intensity of the electric field may be set to be equal to 1.5 kV/mm. If necessary, the polarization process is executed in a state where the temperature of the first piezoelectric plate 13 is raised. For example, the electric field is applied in a state where the temperature of the first piezoelectric plate 13 is held to 100° C. The first piezoelectric plate 13 may be immersed in electrically insulating liquid (e.g., silicon oil) during the polarization process being executed on the first piezoelectric plate 13 in order to prevent any dielectric breakdown from taking place between the electrodes due to the electric field being applied to the electrodes.

If necessary, an aging process is executed after polarizing the first piezoelectric plate 13. More specifically, after the polarization process, the piezoelectric characteristics of the first piezoelectric plate 13 can be stabilized by keeping the polarized first piezoelectric plate 13 in a state where its temperature is raised. In an aging process, the polarized first piezoelectric plate 13 is left in an oven whose inside is heated to 100° C. for 10 hours. If necessary, all the electrodes may be short circuited.

Figure 3E:
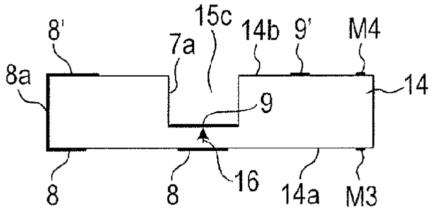

Then, as illustrated in FIG. 3E, the following process is executed on a second piezoelectric plate 14. A third mark M3, a fourth mark M4, first electrodes 8, a second electrode 9, a first electrode pad 8', a second electrode pad 9' and an electrode wiring 8*a* for connecting the first electrodes 8 and the first electrode pad 8' are formed on the second piezoelectric plate 14. Furthermore, an electrode wiring (not illustrated) for connecting the second electrode 9 and the second electrode pad 9' and a third groove 15*c* are formed. The techniques to be employed for forming the above items on the second piezoelectric plate 14 are same as the techniques employed for forming the comparable items on the first piezoelectric plate 13. Subsequently, an electric field is applied between the first electrode pad 8' and the second electrode pad 9' to execute a polarization process on the bottom surface of the third groove 15*c*. The main direction of the polarization is the direction indicated by arrow 16 in FIG. 3E. While the second electrode 9 is formed only on the bottom surface of the third groove 15*c* in FIG. 3E, the second electrode 9 may also be formed on the lateral surfaces of the third groove 15*c*. The second piezoelectric plate 14 is made of a material same as the material of the first piezoelectric plate 13. The second piezoelectric plate 14 may typically be a PZT plate having dimensions of 50 mm×50 mm×0.25 mm. As an example of forming third grooves 15*c*, they may be arranged periodically. The length of each of the grooves is 50 mm and the groove width is 0.22 mm while the groove depth is 0.15 mm, the gap separating any two adjacent grooves being 0.424 mm.

The techniques employed for processing the first piezoelectric plate 13 as described above by referring to FIGS. 3A through 3D are also employed for processing the second piezoelectric plate 14.

Figure 3F:
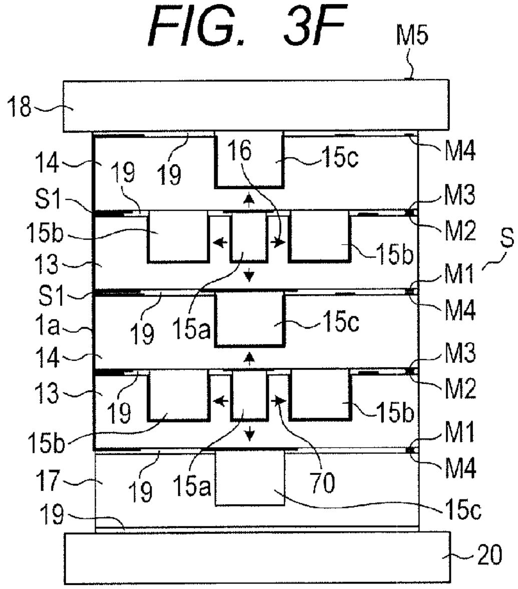

Then, as illustrated in FIG. 3F, second piezoelectric plates 14 and first piezoelectric plates 13 that have been processed in the above-described way are alternately laid on a first support plate 18 to form a desired number of layers. Finally, a third piezoelectric plate 17 and a second support plate 20 are bonded to the above layers.

The determined number of plates is bonded onto the first support plate 18 by referring to a fifth mark M5 formed on the first support plate 18. For example, when a second piezoelectric plate 14 is to be bonded, the fourth mark M4 on the second piezoelectric plate 14 is aligned with the fifth mark M5. When a first piezoelectric plate is to be bonded, the second mark M2 on the first piezoelectric plate 13 is aligned with the fifth mark M5. When a third piezoelectric plate 17 is to be bonded, the fourth mark M4 on the third piezoelectric plate 17 is aligned with the fifth mark M5. A second piezoelectric plate 14 may be used as a third piezoelectric plate 17 without any modification. Alternatively, a second piezoelectric plate 14 on which no electrode is formed may be used as a third piezoelectric plate 17 (as illustrated in FIG. 3F).

The first support plate 18 preferably has a flexural rigidity greater than the second piezoelectric plate 14 or the first piezoelectric plate 13 that has been processed to produce one or more grooves. The flexural rigidity at the bottom of the groove that represents the smallest flexural rigidity value may be used as the flexural rigidity of a piezoelectric plate that has been processed to produce one or more grooves. The flexural rigidity at the bottom of a groove in a piezoelectric plate can be determined easily on the basis of the material constant of the piezoelectric plate and the profile of the groove.

The first support plate 18 may be a flat plate. Since the flexural rigidity of a flat plate is determined by the material constant of the plate and the plate thickness, the flexural rigidity of the first support plate 18 can be easily calculated when a flat plate is used as the first support plate 18.

The piezoelectric plates that have been bonded to the first support plate 18 may sometimes be processed and heated with the first support plate 18 in a latter step. The piezoelectric plates preferably are made of a material same as the material of the first support plate 18 by considering the ease of processing in such a step and the thermal expansion of the plates that may take place when they are heated.

The material of the second support plate 20 may be selected on the criteria applied to the selection of the first support plate 18. The second support plate 20 may not be necessary in some instances.

For example, bonding layers 19 may be used for bonding piezoelectric plates 14 and 17 and support plates 18 and 20 and for bonding piezoelectric plates 13, 14 and 17 each other. Such a bonding layer 19 may typically be made of a thermosetting resin material. The thickness of such a bonding layer 19 is typically between 1 and 3 μm. The bonding strength along a bonding interface S1 is typically not less than 3 MPa. Such a level of bonding strength can easily be achieved by means of a commercially available adhesive agent. As for the sequence of bonding operation, after applying a first bonding layer 19 onto the second main surface 13*b* of a first piezoelectric plate 13 (or on the second main surface 14*b* of a second piezoelectric plate 14), the plates to be bonded together are aligned and then actually bonded in predetermined pressure and heating conditions.

If necessary, a laminated body S of piezoelectric plates that is produced by bonding the piezoelectric plates in the above-described manner is subjected to a cutting and dividing process (not illustrated). A plurality of piezoelectric element substrates 1, each having a desired number of pressure chambers 2, each of which has a desired length, can be obtained from a single laminated body S as a result of such a cutting and dividing process. If necessary, the cross sections produced by the cutting and dividing process may be ground and precisely flattened and the dimensions of the piezoelectric element substrate 1 may be regulated. In such a cutting and dividing process, if necessary, the first electrodes 8 and the first electrode pads 8' may be cut from each other to make each of the first electrodes 8 independent. A similar operation may be executed for the second electrodes 9 and the second electrode pads 9'.

As a finished laminated body S is produced, the first grooves 15*a* become pressure chambers 2 and the second grooves 15*b* and the third grooves 15*c* also become through holes 7.

Figure 3G:
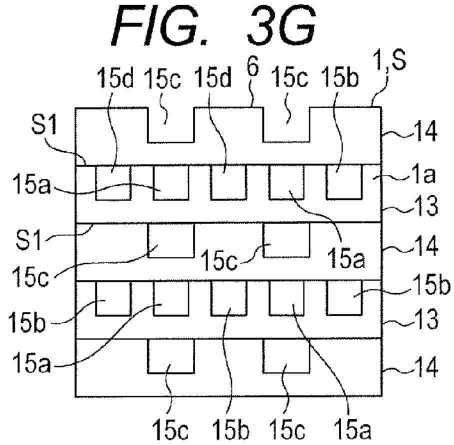

FIG. 3G illustrates the surface of an end of a pressure chamber 2 of a piezoelectric element substrate 1 prepared by way of the above-described steps. This surface is same as one of the surfaces of the laminated body S. The thickness (the dimension in the Z-direction) of the piezoelectric element substrate 1, in other words the longitudinal length of each of the first grooves 15*a*, the second grooves 15*b* and the third grooves 15*c*, is typically 10 mm. The electrodes and the adhesive agent are omitted from FIG. 3G for the purpose of easy understanding.

Figure 3H:
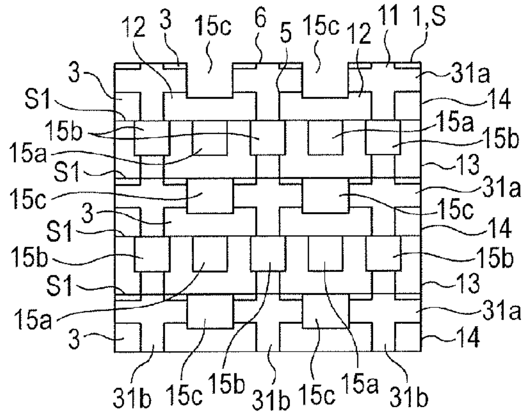

Then, as illustrated in FIG. 3H, first dividing grooves 31*a* and second dividing grooves 31*b* are formed in the piezoelectric element substrate 1 so as to form a grid of grooves in order to produce the independent parts 5 of the piezoelectric element substrate 1. The first dividing grooves 31*a* and the second dividing grooves 31*b* typically have a depth (the dimension in the Z-direction) of 3 mm.

The first dividing grooves 31*a* are arranged in the direction running in parallel with the bonding interfaces S1 (in the X-direction). They are formed on the second piezoelectric plates 14 such that each pair of them sandwiches a corresponding one of the first grooves 15*a* of the first piezoelectric plates 13. The first dividing grooves 31*a* have a width (the dimension of each of the grooves in the Y-direction) smaller than the depth of the third grooves 15*c* in the second piezoelectric plates 14. The second dividing grooves 31*b* are arranged in a direction perpendicular to the bonding interfaces S1 (in the Y-direction). They are formed on the first piezoelectric plates 13 and on the second piezoelectric plates 14 such that each pair of them sandwiches a corresponding one of the first grooves 15*a* of the first piezoelectric plates 13. The second dividing grooves 31*b* have a width (the dimension of each of the grooves in the Y-direction) smaller than the depth of the second grooves 15*b* in the first piezoelectric plates 13. As each of the first grooves 15*a* is made to correspond to a pressure chamber 2 and each of the second grooves 15*b* and the third grooves 15*c* is made to correspond to a through hole 7, a piezoelectric element substrate 1 having an independent part 5 that includes a plurality of column-shaped piezoelectric portions 41 that are independent from each other and a continuous part 6 that includes a plate-shaped piezoelectric portion 42 is obtained. In FIG. 3F, the lateral walls 3 of each of the pressure chambers have projecting sections 12 (see FIGS. 1A through 1D illustrating the first embodiment).

The width of each of the first dividing grooves 31*a* is made to be greater than the depth of the third grooves 15*c* of the second piezoelectric plate 14 (the dimension of each of the grooves in the Y-direction) and the width of each of the second dividing grooves 31*b* is made to be greater than the depth of the second grooves 15*b* of the first piezoelectric plate 13 (the dimension of each of the grooves in the Y-direction). Then, as a result, the second embodiment of piezoelectric element substrate 1 as illustrated in FIGS. 2A through 2D is obtained. However, note that, in such an instance, second electrodes 9 need to be formed anew on the outer surfaces 41*a* of the column-shaped piezoelectric portions 41 of the independent part 5 after forming dividing grooves 31*a* and 31*b*. The electrodes can be formed typically by way of a plating process. For the plating process, if necessary, the surfaces other than the outer surfaces 41*a* of the column-shaped piezoelectric portions 41 are protected. A technique of electrically isolating the first electrodes 8, the second electrodes 9 and the third electrodes 10 by polishing them can suitably be used on the entire surface of the piezoelectric element substrate 1 after the plating process.

With this embodiment as described above, the first embodiment and the second embodiment of piezoelectric element substrate 1 can be manufactured in a simple and easy way.

Liquid Ejection Head

Figure 4A:
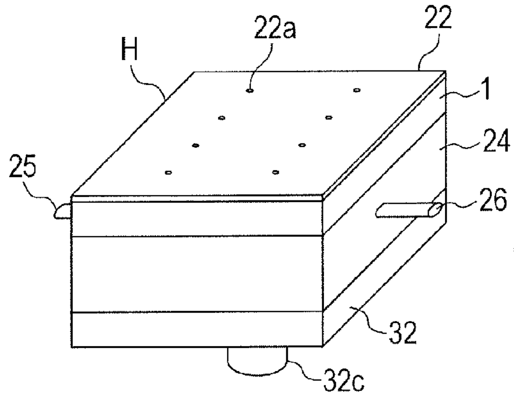
FIGS. 4A, 4B, 4C, 4D, 4E, 4F and 4G are schematic illustrations of a liquid ejection head having a piezoelectric element substrate according to an embodiment of the present invention.

Now, an embodiment of liquid ejection head having a piezoelectric element substrate will be described below by referring to FIGS. 4A through 4G. Note that the components of the embodiment that are same as or similar to their counterparts of the above-described embodiments are denoted by the same reference symbols and will not be described repeatedly. FIGS. 4A through 4G are schematic illustrations of this embodiment of liquid ejection head having a piezoelectric element substrate. FIG. 4A is a schematic perspective view of the liquid ejection head and FIGS. 4B through 4E are exploded views of the liquid ejection head.

The liquid ejection head of this embodiment has a structural feature of cooling the piezoelectric element substrate 1 by utilizing the through holes 7 of the continuous part 6 of the piezoelectric element substrate 1.

FIG. 4A is a schematic perspective view of the liquid ejection head H. The liquid ejection head H is produced by assembling a nozzle plate 22, a piezoelectric element substrate 1, a flow dividing member 24 for dividing a fluid and a common ink chamber 32 in the above-mentioned order from the ejection port side to the ink supply port side of the liquid ejection head H. The assembling is typically realized by bonding the components by means of an adhesive agent.

Figure 4E:
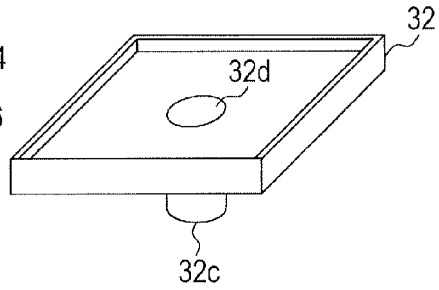
Figure 4B:
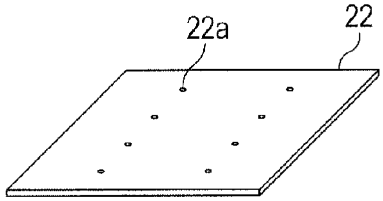
Figure 4F:
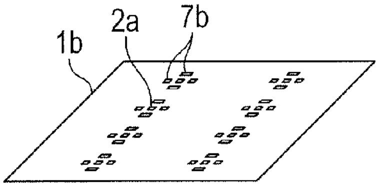

As illustrated in FIG. 4B, the nozzle plate 22 has ejection ports 22*a* that correspond to the respective pressure chambers 2 of the piezoelectric element substrate 1. The nozzle plate 22 is typically made of a 30 μm-thick Ni thin film. Each of the ejection ports 22*a* has a diameter of 15 μm.

Figure 4C:
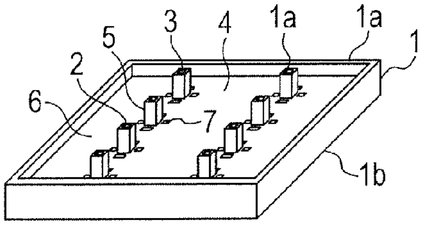

As illustrated in FIG. 4C, the piezoelectric element substrate 1 has a plurality of pressure chambers 2. The piezoelectric element substrate 1 may be the first embodiment or the second embodiment of piezoelectric element substrate that is described above. The piezoelectric element substrate 1 has an independent part 5 at the side of the ejection ports 22*a* (at the upper side in FIG. 4C) and a continuous part 6 at the ink supply side (at the lower side in FIG. 4C). Each of the pressure chambers is surrounded by through holes 7, each of which communicates with the continuous part 6. At the surface 1*b* located at the ink supply side of the piezoelectric element substrate 1, an inlet aperture 2*a* of the pressure chamber 2 and inlet apertures 7*b* of the respective through holes 7 are provided (see FIG. 4F). The wirings (not illustrated) of the piezoelectric element substrate 1 can be drawn out by way of the surface (e.g., the surface 1*b* at the ink supply side or the lateral surfaces of the substrate 1). Alternatively, the wirings (not illustrated) of the piezoelectric element substrate 1 can be drawn out by way of a wiring substrate (not illustrated) arranged between the nozzle plate 22 and the piezoelectric element substrate 1, or between the piezoelectric element substrate 1 and the flow dividing member 24. When a wiring substrate is utilized, necessary apertures need to be arranged at the wiring substrate.

Figure 4G:
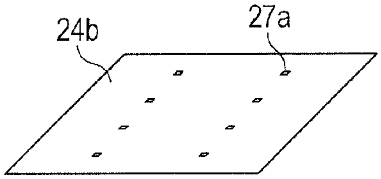
Figure 4D:
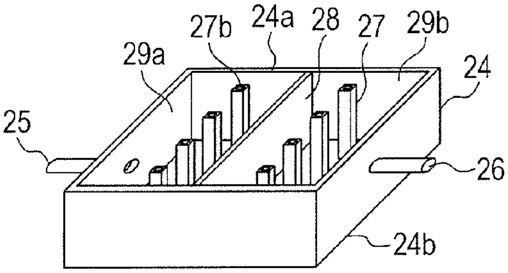

As illustrated in FIG. 4D, the flow dividing member 24 has ink channels 27 for holding the pressure chambers 2 in communication with a common ink chamber 32 (see FIG. 4E) that is provided to store ink to be supplied to the pressure chambers 2, a coolant introducing port 25 and a coolant discharging port 26. Further, the flow dividing member 24 has a separating section 28 that separates the coolant introducing port 25 and the coolant discharging port 26. As illustrated in FIG. 4G, the surface 24*b* of the flow dividing member 24 located at the side of the common ink chamber 23 is provided with apertures 27*a* that are respectively linked to the corresponding ink channels 27.

As illustrated in FIG. 4E, the common ink chamber has an ink supply port 32*c* for supplying ink to the common ink chamber 32 and an ink chamber entrance 32*d*.

The ink flow of the liquid ejection head of this embodiment will be described below. Ink is supplied from an ink pool (not illustrated) with a predetermined pressure by way of the ink supply port 32*c* of the common ink chamber and then introduced into the common ink chamber 32 through the ink chamber entrance 32*d*. The ink in the common ink chamber 32 then enters into the ink channels 27 by way of the respective inlet apertures 27*a*. Then, the ink gets into the pressure chambers 2 from the outlet apertures 27*b* of the ink channels by way of the inlet apertures 2*a* of the pressure chambers of the piezoelectric element substrate 1. The ink that gets into the pressure chambers 2 deform the pressure chambers 2 as a drive signal is input to the first through third electrodes 8, 9 and 10 of the piezoelectric element substrate 1. Then, the ink is ejected from the ejection ports 22*a*.

Now, the coolant flow of the liquid ejection head of this embodiment will be described below. The coolant in the liquid ejection head is a fluid whose temperature is controlled. The coolant may be air, water or ink. The temperature of the coolant is typically 23° C. The coolant whose temperature is controlled is introduced from a coolant pool (not illustrated) into coolant chamber 29*a* by way of the coolant introducing port 25 of the flow dividing member 24 under pressure at a predetermined pressure level. The coolant in the coolant chamber 29*a* is forced to flow under pressure from the apertures 7*b* of the through holes 7 that are located at the ink supply side surface of the piezoelectric element substrate 1 and held in communication with the coolant chamber 29*a* into the through holes 7 of the piezoelectric element substrate 1 and then into the space 4 to cool the piezoelectric element substrate 1. The coolant that is heated by the piezoelectric element substrate 1 then enters from the space 4 into coolant chamber 29*b* by way of the apertures 7*b* of the piezoelectric element substrate 1 that are held in communication with the coolant chamber 29*b*. The coolant in the coolant chamber 29*b* is returned to the coolant pool (not illustrated) from the coolant discharging port 26. Thus, the piezoelectric element substrate 1 can be cooled by the circulating coolant.

As described above, this embodiment of liquid ejection head having a piezoelectric element substrate according to the present invention can directly cool the lateral walls of the pressure chambers 2 by means of the coolant due to the existence of the space 4 and the through holes 7 in the piezoelectric element substrate 1. Such direct cooling not only provides a high cooling efficiency if compared with cooling a piezoelectric element substrate from around the piezoelectric element but also reduces any uneven temperature distribution of the piezoelectric element. Additionally, the temperature of the ink in the pressure chambers 2 can be controlled accurately. Furthermore, this cooling system is not subjected to any limitations to cooling due to the limitation to the ink flow rate in the liquid ejection head if compared with cooling by circulation of ink flowing through the insides of the pressure chambers 2 and thus, does not affect the ejection stability.

While the present invention has been described with reference to exemplary embodiments, it is to be understood that the invention is not limited to the disclosed exemplary embodiments. The scope of the following claims is to be accorded the broadest interpretations so as to encompass all such modifications and equivalent structures and functions.

This application claims the benefit of Japanese Patent Application No. 2012-140725, filed Jun. 22, 2012, which is hereby incorporated by reference herein in its entirety.

What is claimed is:

1. A liquid ejection head having a plurality of pressure chambers with lateral walls formed by using piezoelectric elements, an end of each of the pressure chambers being held in communication with an ejection port for ejecting ink, the opposite end being held in communication with a supply port for supplying ink to the pressure chamber, the liquid ejection head being so configured as to eject ink from each of the ejection ports as a result of a capacity change of each of the pressure chambers due to an expansion or contraction of the piezoelectric elements, the liquid ejection head comprising:

a piezoelectric element substrate formed by using piezoelectric elements;

a nozzle plate having the ejection ports;

a flow dividing member having a coolant discharging port, a coolant introducing port, a separating section separating the space in which the coolant introducing port is located from the space in which the coolant discharging port is located, and ink channels, each of which runs through the space in which the coolant introducing port is located or the space in which the coolant discharging port is located; and a common ink chamber for storing ink to be supplied to the piezoelectric element substrate, the piezoelectric element substrate comprising:

a plate-shaped piezoelectric portion having a plurality of holes running through the plate-shaped piezoelectric portion from a surface thereof to the opposite surface and a plurality of through-holes located around the holes; and a plurality of column-shaped piezoelectric portions arranged on one of the surfaces of the plate-shaped piezoelectric portion at positions corresponding to the holes of the plate-shaped piezoelectric portion and having respective hollow sections open at the opposite ends thereof, wherein each of the holes of the plate-shaped piezoelectric portion and the corresponding one of the hollow sections of the column-shaped piezoelectric portions forming a pressure chamber having an end thereof located at the side of the column-shaped piezoelectric portion and the opposite end located at the side of the plate-shaped piezoelectric portion, the common ink chamber, the flow dividing member, the piezoelectric element substrate and the nozzle plate are laid one on the other in the above mentioned order, and the ejection ports are linked to the common ink chamber by way of the respective pressure chambers and the ink channel, while each of the through-holes is linked to the space in which the coolant introducing port is located or the space in which the coolant discharging port is located.

2. The liquid ejection head according to claim 1, further comprising:

a first electrode provided on the inner surface of each of the pressure chambers;

a second electrode provided on the outer surface of each of the column-shaped piezoelectric portions; and a third electrode formed on the inner surface of each of the through-holes, wherein the first electrodes are electrically insulated from the second electrodes and the third electrodes, and the first electrodes, the second electrodes and the third electrodes are adapted to receive respective drive signals, which are different from each other, for causing the column-shaped piezoelectric portions or the plate-shaped piezoelectric portion to expand or contract.

3. The liquid ejection head according to claim 2, wherein grooves are formed on the outer surface of each of the column-shaped piezoelectric portions and have respective bottom surfaces, each of which is flush with an inner surface of a corresponding one of the through-holes.

4. The liquid ejection head according to claim 1, wherein the pressure chambers and the through-holes are arranged alternately at crossings of a grid as viewed from the side of the ends of the column-shaped piezoelectric portions that are not held in contact with the plate-shaped piezoelectric portion.

5. The liquid ejection head according to claim 1, wherein the outer edges of each of the column-shaped piezoelectric portions are displaced from any inner surfaces of the through-holes as viewed from the side of the ends of the column-shaped piezoelectric portions that are not held in contact with the plate-shaped piezoelectric portion.

6. A method of manufacturing a liquid ejection head according to claim 1, the method comprising:

a step of forming first grooves and second grooves alternately in parallel with each other on each of first surfaces of first piezoelectric plates;

a step of forming a plurality of third grooves in parallel with each other on each of first surfaces of second piezoelectric plates;

a step of forming a laminated body by alternately laying the first piezoelectric plates and the second piezoelectric plates one on the other such that a second surface of one of the second piezoelectric plates is directly laid on the first surface of one of the first piezoelectric plates and a second surface of another one of the first piezoelectric plates is directly laid on the first surface of the second piezoelectric plate and so on while the first grooves, the second grooves and the third grooves are arranged in parallel with each other in the running direction of the grooves; and a step of forming dividing grooves in a grid pattern on one of the surfaces of the laminated body so as to make the first grooves be surrounded by the second grooves and the third grooves in the running direction thereof but not to make the dividing grooves run through the laminated body.

* * * * *